US008309964B2

(12) United States Patent
Kim

(10) Patent No.: US 8,309,964 B2

(45) Date of Patent: Nov. 13, 2012

(54) THIN FILM TRANSISTOR, METHOD OF MANUFACTURING THE THIN FILM TRANSISTOR AND ORGANIC LIGHT EMITTING DISPLAY DEVICE HAVING THE THIN FILM TRANSISTOR

(75) Inventor: Ki-Wook Kim, Yongin (KR)

(73) Assignee: Samsung Electronics Co., Ltd., Yongin (KR)

( * ) Notice: Subject to any disclaimer, the term of this patent is extended or adjusted under 35 U.S.C. 154(b) by 256 days.

(21) Appl. No.: 12/834,195

(22) Filed: Jul. 12, 2010

(65) Prior Publication Data

US 2011/0095286 A1 Apr. 28, 2011

(30) Foreign Application Priority Data

Oct. 27, 2009 (KR) ........................ 10-2009-0102277

(51) Int. Cl.
*H01L 29/04* (2006.01)

(52) U.S. Cl. .................... 257/72; 257/59; 257/E29.273; 257/E21.411; 438/149; 438/158

(58) Field of Classification Search .................... 257/59, 257/72, E29.273, E21.411; 438/149, 158
See application file for complete search history.

(56) References Cited

U.S. PATENT DOCUMENTS

| | | | |
|---|---|---|---|
| 2009/0102751 | A1 | 4/2009 | Takatoku |
| 2009/0140243 | A1 | 6/2009 | Kim et al. |

FOREIGN PATENT DOCUMENTS

| | | |
|---|---|---|
| JP | 11-233783 | 8/1999 |
| JP | 2009-099778 | 5/2009 |
| KR | 10-1999-0031885 | 5/1999 |
| KR | 1020080078409 | 8/2008 |
| KR | 10-2009-0056590 | 6/2009 |

*Primary Examiner* — David Vu

(74) *Attorney, Agent, or Firm* — H. C. Park & Associates, PLC

(57) ABSTRACT

A thin film transistor (TFT) using an oxide semiconductor as an active layer, a method of manufacturing the TFT and an organic light emitting display device having the TFT. In one embodiment, a TFT includes a first gate electrode formed on a substrate. A source electrode is formed to be spaced apart from the gate electrode on the substrate. A first insulating layer is formed on the substrate. An active layer is formed of an oxide semiconductor on the first insulating layer, and connected to the source electrode. A second insulating layer is formed on the first insulating layer. A second gate electrode is formed on the second insulating layer so as not to overlap with the first gate electrode. A drain electrode is formed to be spaced apart from the second gate electrode on the second insulating layer, and connected to the active layer.

16 Claims, 4 Drawing Sheets

22b
22a
18
24
20
16
12
10
14a
14b

THIN FILM TRANSISTOR, METHOD OF MANUFACTURING THE THIN FILM TRANSISTOR AND ORGANIC LIGHT EMITTING DISPLAY DEVICE HAVING THE THIN FILM TRANSISTOR

CROSS-REFERENCE TO RELATED APPLICATION

This application claims the benefit of Korean Patent Application No. 10-2009-0102277, filed on Oct. 27, 2009, in the Korean Intellectual Property Office, the disclosure of which is incorporated herein by reference.

BACKGROUND

1. Field

An aspect of the present invention relates to a thin film transistor (TFT) using an oxide semiconductor as an active layer, a method of manufacturing the TFT and an organic light emitting display device having the TFT. More particularly, an aspect of the present invention relates to a TFT having two gate electrodes disposed into a non-symmetric structure, a method of manufacturing the TFT and an organic light emitting display device having the TFT.

2. Description of the Related Art

In general, a thin film transistor (TFT) includes an active layer and a gate electrode. Here, the active layer provides channel, source and drain regions. The gate electrode overlaps with the channel region and is isolated from the active layer by a gate insulating layer.

The active layer of the TFT configured as described above is usually formed of a semiconductor such as amorphous silicon or poly-silicon. However, if the active layer is formed of amorphous silicon, mobility is low, and therefore, it is difficult to implement a drive circuit operated at a high speed. If the active layer is formed of poly-silicon, the mobility is high, but threshold voltage is uneven. Therefore, a separate compensating circuit is necessarily added.

In a related art method of manufacturing a TFT using a low temperature poly-silicon (LTPS), a high-priced process such as laser heat treatment is performed, and it is difficult to control characteristics of the TFT. Therefore, it is difficult to apply the related art method to large-area substrates.

To solve such and/or other problems, studies have recently been conducted to develop a TFT using an oxide semiconductor as an active layer.

Japanese Laid-Open Patent Application No. 2004-273614 discloses a TFT in which a zinc oxide (ZnO) or an oxide semiconductor using the ZnO as a main element is used as an active layer.

The oxide semiconductor using the ZnO as a main element is a material that is amorphous and stable. Such an oxide semiconductor is used as an active layer, so that a TFT can be manufactured at a low temperature using existing processing equipment without the need of additional separate processing equipment, so that an ion implanting process can be omitted, and the like.

However, the unit resistance of the oxide semiconductor is higher than that of the poly-silicon. Therefore, the structure of the related art TFT has difficulty implementing electrical characteristics necessary for a pixel drive circuit of a display device or a peripheral circuit.

SUMMARY

In one embodiment of the present invention, there are provided a thin film transistor (TFT) using an oxide semiconductor as an active layer and having improved electrical characteristics, a method of manufacturing the TFT and an organic light emitting display device having the TFT.

In another embodiment of the present invention, there are provided a TFT having two gate electrodes disposed into a non-symmetric structure, a method of manufacturing the TFT and an organic light emitting display device having the TFT.

In still another embodiment of the present invention, there are provided a TFT capable of minimizing leakage current between source and drain electrodes, a method of manufacturing the TFT and an organic light emitting display device having the TFT.

According to an aspect of the present invention, there is provided a TFT including a substrate; a first gate electrode formed on the substrate; a source electrode formed to be spaced apart from the gate electrode on the substrate; a first insulating layer formed on the substrate having the first gate electrode and the source electrode; an active layer formed of an oxide semiconductor on the first insulating layer having the first gate electrode and the source electrode, the active layer being connected to the source electrode; a second insulating layer formed on the first insulating layer having the active layer; a second gate electrode formed on the second insulating layer so as not to overlap with the first gate electrode; and a drain electrode formed to be spaced apart from the second gate electrode on the second insulating layer, the drain electrode being connected to the active layer.

According to another aspect of the present invention, there is provided a method of manufacturing a TFT, which includes forming a first gate electrode and a source electrode on a substrate; forming a first insulating layer on the substrate having the first gate electrode and the source electrode and then forming a first contact hole so that a portion of the source electrode is exposed; forming an active layer with an oxide semiconductor on the first insulating layer so as to be connected to the source electrode through the first contact hole; forming a second insulating layer on the first insulating layer having the active layer and then forming a second contact hole so that a portion of the active layer is exposed; and forming a drain electrode connected to the active layer through the second contact hole and a second gate electrode disposed not to overlap with the first gate electrode on the second insulating layer.

According to still another aspect of the present invention, there is provided an organic light emitting display device having a TFT, which includes a first substrate having an organic light emitting element and a TFT formed thereon, the organic light emitting element having a first electrode, an organic light emitting layer and a second electrode, and the TFT controlling operations of the organic light emitting element; and a second substrate disposed opposite to the first substrate, wherein the TFT comprises: a first gate electrode formed on the first substrate; a source electrode formed to be spaced apart from the gate electrode on the first substrate; a first insulating layer formed on the first substrate having the first gate electrode and the source electrode; an active layer formed with an oxide semiconductor on the first insulating layer having the first gate electrode and the source electrode, the active layer being connected to the source electrode; a second insulating layer formed on the first insulating layer having the active layer; a second gate electrode formed on the second insulating layer so as not to overlap with the first gate electrode; and a drain electrode formed to be spaced apart from the second gate electrode on the second insulating layer, the drain electrode being connected to the active layer.

A TFT according to an embodiment of the present invention may have two gate electrodes disposed into a non-symmetric structure about the active layer formed of an oxide semiconductor. Since the two gate electrodes are disposed in different layers, respectively, the gap (offset region) between the two gate electrodes can be decreased by a critical value of photolithography equipment or less. Accordingly, current characteristics of a certain level or more can be implemented in the active layer formed of the oxide semiconductor having a higher unit resistance that that of poly-silicon. Further, since two channels are formed in active layers corresponding to the two gate electrodes, respectively, a current drive circuit can be easily implemented through control of threshold voltages and electrical characteristics.

In addition, the TFT according to an embodiment of the present invention may have an offset region between the two gate electrodes. Since the width of a channel is relatively decreased in the active layer corresponding to the offset region, leakage current between the source and drain electrodes can be minimized. Accordingly, by using a high unit resistance of the oxide semiconductor, a channel having a relatively narrow width is formed between the two channels, so that flow of current can be restricted.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Figure 1:
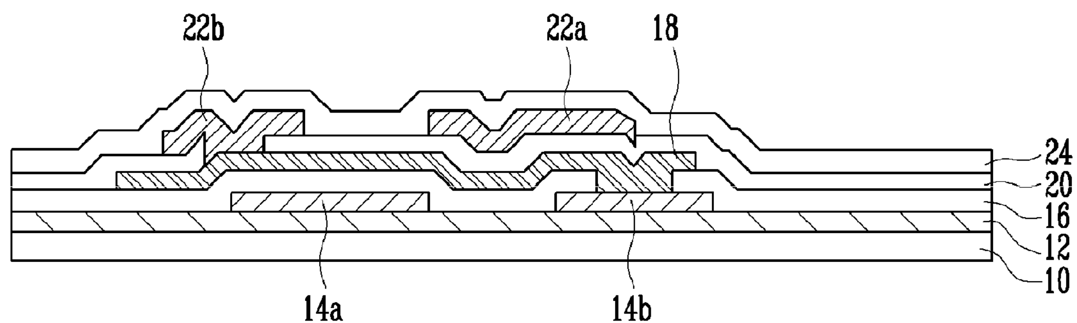
FIG. 1 is a sectional view of a thin film transistor (TFT) according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it can be directly on the other element or be indirectly on the other element with one or more intervening elements interposed therebetween. Also, when an element is referred to as being "physically connected to" another element, it can be directly connected to the other element or be indirectly connected to the other element with one or more intervening elements interposed therebetween. Hereinafter, like reference numerals refer to like elements.

FIG. 1 is a sectional view of a thin film transistor (TFT) according to an embodiment of the present invention. Referring to FIG. 1, a buffer layer 12 is formed on a substrate 10, and a first gate electrode 14*a* and a source electrode 14*b* are formed on the buffer layer 12. The first gate electrode 14*a* and the source electrode 14*b* are formed to be spaced apart from each other by a predetermined gap. A first insulating layer 16 is formed on the buffer layer 12 having the first gate electrode 14*a* and the source electrode 14*b*. An active layer made of an oxide semiconductor is formed on the first insulating layer 16 having the first gate electrode 14*a* and the source electrode 14*b*. One side portion of the active layer 18 is connected to the source electrode 14*b* through a contact hole formed in the first insulating layer 16.

A second insulating layer 20 is formed on the first insulating layer 16 having the active layer 18, and a second gate electrode 22*a* and a drain electrode 22*b* are formed on the second insulating layer 20. The second gate electrode 22*a* is disposed into a non-symmetric structure so as not to overlap with the first gate electrode 14*a*.

In FIG. 1, the source electrode 14*b* and the first gate electrode 14*a* are disposed on the same plane, and the drain electrode 22*b* and the second gate electrode 22*a* are disposed on the same plane. However, the drain electrode 22*b* and the first gate electrode 14*a* may be disposed on the same plane, and the source electrode 14*b* and the second gate electrode 22*a* may be disposed on the same plane.

In the TFT configured as described above, if a bias voltage ($V_G$) is applied to the first and second gate electrodes 14*a* and 22*a*, an electric field allows channels to be respectively formed at portions overlapping with the first and second gate electrodes 14*a* and 22*a* in the active layer 18.

In the related art TFT having only one gate electrode, one channel is formed at a portion overlapping with the gate electrode in an active layer. However, in the TFT of an embodiment of the present invention, channels are formed at the portions overlapping with the first and second gate electrodes 14*a* and 22*a* in the active layer 18, respectively. Accordingly, the current characteristics of the TFT of an embodiment of the present invention can be improved as compared with the related art TFT.

Figure 2:
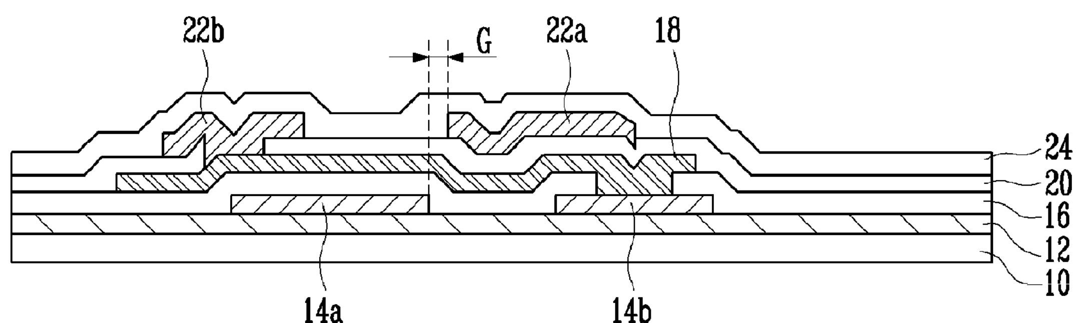
FIG. 2 is a sectional view of a TFT according to another embodiment of the present invention.

FIG. 2 is a sectional view of a TFT according to another embodiment of the present invention. Referring to FIG. 2, the TFT of this embodiment has the same structure as the TFT of FIG. 1. The TFT of this embodiment is different from the TFT of FIG. 1 in that the first and second gate electrodes 14*a* and 22*a* are formed to be spaced apart from each other at a predetermined gap G (hereinafter, the spaced gap is referred to as an offset region).

In the TFT of FIG. 1, edges of the first and second gate electrodes 14*a* and 22*a* do not overlap with each other but are disposed on the same line. However, in the TFT of FIG. 2, the edges of the first and second gate electrodes 14*a* and 22*a* are spaced apart from each other by the gap G.

Since the width of a channel is relatively decreased in the active layer 18 corresponding to the offset region between the first and second gate electrodes 14*a* and 22*a*, leakage current between the source and drain electrodes can be minimized. A channel having a relatively narrow width is formed between two channels by using the high unit resistance of the oxide semiconductor, so that the flow of current can be restricted.

Hereinafter, a method of manufacturing a TFT will be described in a more detailed manner.

FIGS. 3A to 3D are sectional views illustrating a method of manufacturing a TFT according to an embodiment of the present invention.

Referring to 3A, a buffer layer 12 is formed on a substrate 10. A conductive layer is formed on the buffer layer 12 and then patterned, thereby forming a first gate electrode 14*a* and a source electrode 14*b*. The first gate electrode 14*a* and the source electrode 14*b* are formed to be spaced apart from each other by a predetermined gap.

An insulating substrate such as transparent glass or plastic is used as the substrate 10. The buffer layer 12 is formed of a silicon oxide, a silicon nitride or a compound of the silicon oxide and the silicon nitride. The conductive layer is formed of a metal selected from the group consisting of tungsten (W), titanium (T), molybdenum (Mo), silver (Ag), tantalum (Ta), aluminum (Al), copper (Cu), gold (Au), chrome (Cr) and niobium (Nb), or alloy thereof.

Figure 3A:
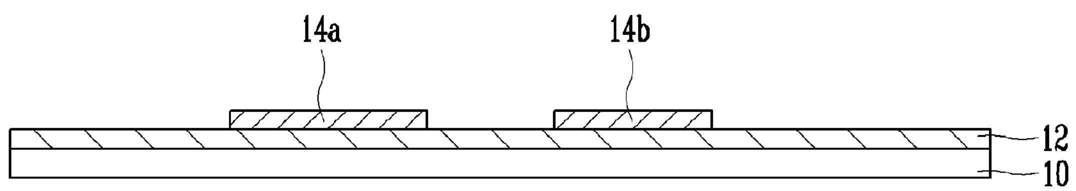
FIGS. 3A to 3D are sectional views illustrating a method of manufacturing a TFT according to an embodiment of the present invention.
Figure 3B:
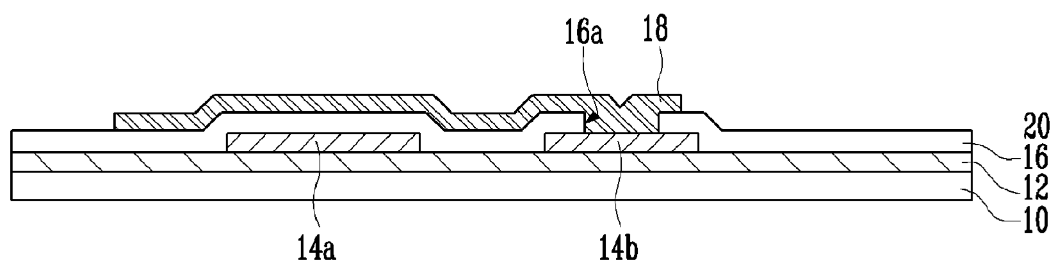

Referring to FIG. 3B, a first insulating layer 16 is formed on the buffer layer 12 having the first gate electrode 14*a* and the source electrode 14*b*, and a contact hole 16*a* is formed in the first insulating layer 16 so that a portion of the source electrode 14*b* is exposed. An oxide semiconductor layer is formed on the first insulating layer having the first gate electrode 14*a* and the source electrode 14*b* and then patterned, thereby forming an active layer 18. One side portion of the active layer 18 is connected to the source electrode 14*b* through the contact hole 16*a*.

The oxide semiconductor layer may include zinc oxide (ZnO). The ZnO may be doped with at least one ion selected from the group consisting of gallium (Ga), indium (In), stannum (Sn), zirconium (Zr), halfnium (Hf), cadmium (Cd), magnesium (Mg) and vanadium (V).

Figure 3C:
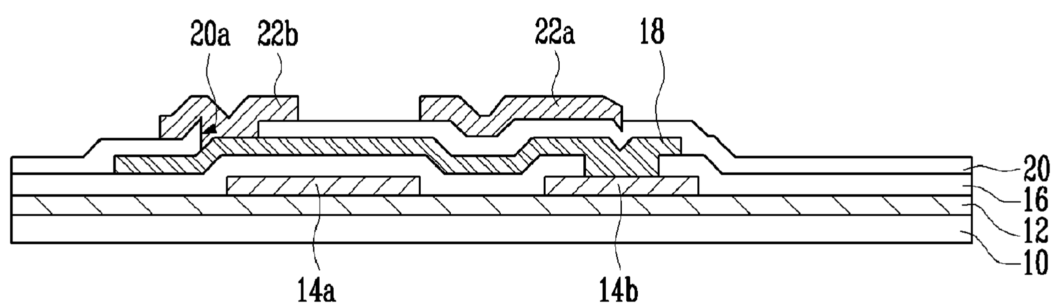

Referring to FIG. 3C, a second insulating layer 20 is formed on the first insulating layer 16 having the active layer 18, and a contact hole 20*a* is formed in the second insulating layer 20 so that the other side portion of the active layer 18 is exposed. A conductive layer is formed on the second insulating layer 20 and then patterned, thereby forming a second gate electrode 22*a* and a drain electrode 22*b*.

The second gate electrode 22*a* does not overlap with the first gate electrode 14*a*, and an edge of the second gate electrode 22*a* is spaced apart from an edge of the first gate electrode 14*a* by a predetermined gap G. The drain electrode 22*b* is spaced apart from the second gate electrode 22*a* and connected to the other side portion of the active layer 18 through the contact hole 20*a*.

The conductive layer is formed of a metal selected from the group consisting of tungsten (W), titanium (T), molybdenum (Mo), silver (Ag), tantalum (Ta), aluminum (Al), copper (Cu), gold (Au), chrome (Cr) and niobium (Nb), or alloy thereof.

Figure 3D:
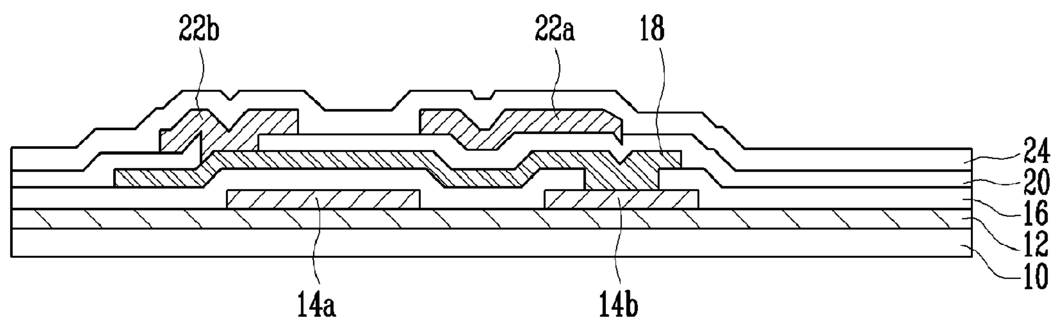

Referring to FIG. 3D, a protection layer 24 is formed on the second insulating layer 20 having the second gate electrode 22*a* and the drain electrode 22*b*.

As described above, since the first and second gate electrodes 14*a* and 22*a* are formed in different layers, respectively, the gap (offset region) between the first and second gate electrodes 14*a* and 22*a* can be decreased by a critical value of photolithography equipment or less. Accordingly, current characteristics of a certain level or more can be implemented in the active layer 18 formed of an oxide semiconductor having a higher unit resistance that that of poly-silicon.

The TFT configured as described above can be applied to an organic light emitting display device.

Figure 4A:
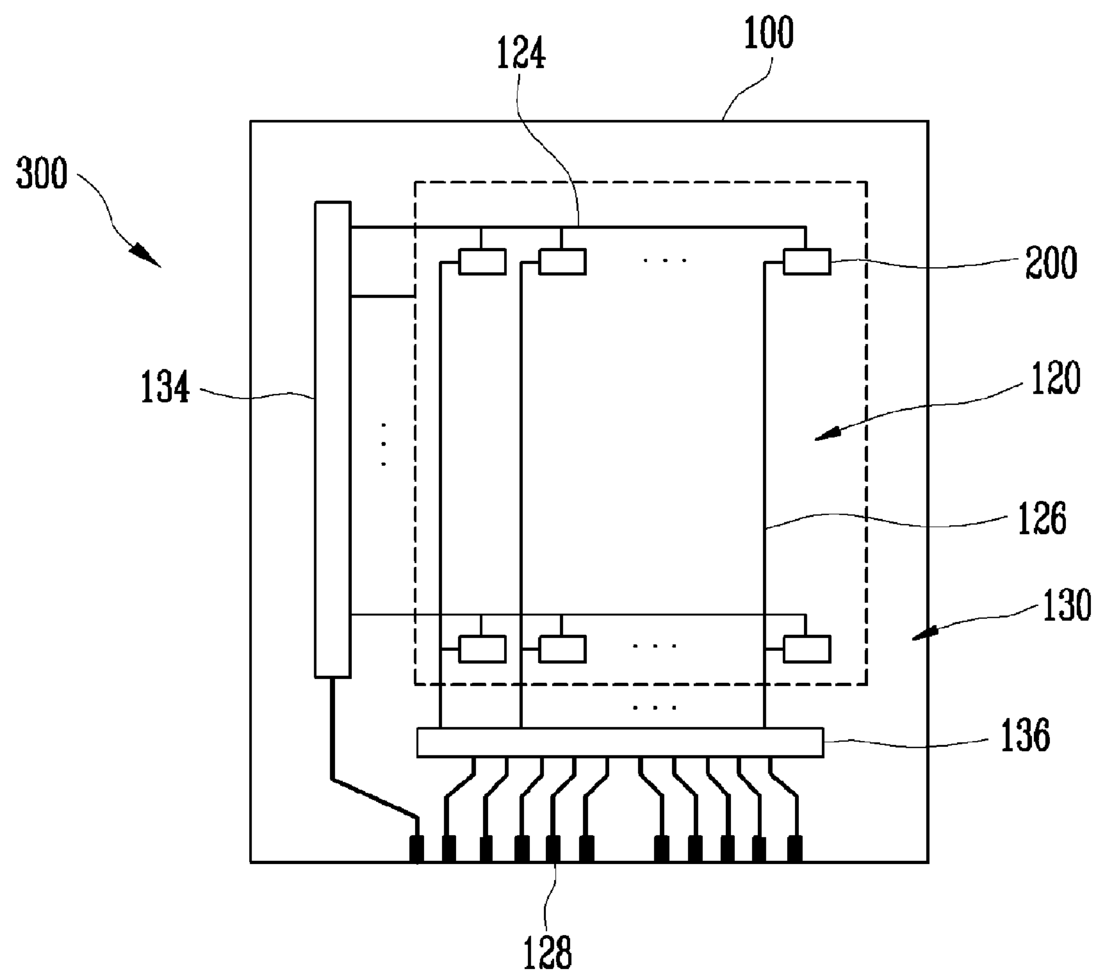
FIGS. 4A and 4B are plan and sectional views of an organic light emitting display device having a TFT according to an embodiment of the present invention.
Figure 4B:
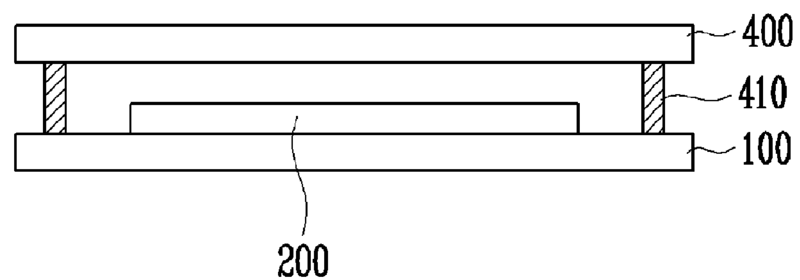

FIGS. 4A and 4B are plan and sectional views of an organic light emitting display device having a TFT according to an embodiment of the present invention. A display panel 300 for displaying images will be schematically described.

Referring to FIG. 4A, a substrate 100 is defined by a pixel region 120 and a non-pixel region 130 formed around the pixel region 120. In the pixel region 120 of the substrate 100 are formed a plurality of organic light emitting elements 200 connected to one another in a matrix form between scan and data lines 124 and 126. In the non-pixel region of the substrate 100 are formed scan and data lines 124 and 126 respectively extended from those in the pixel region 120, a power supply line (not shown) for operating the organic light emitting elements 200, and scan and data drivers 134 and 136 for processing signals provided from the exterior through pads 128 and supplying the processed signals to the scan and data lines 124 and 126.

Figure 5:
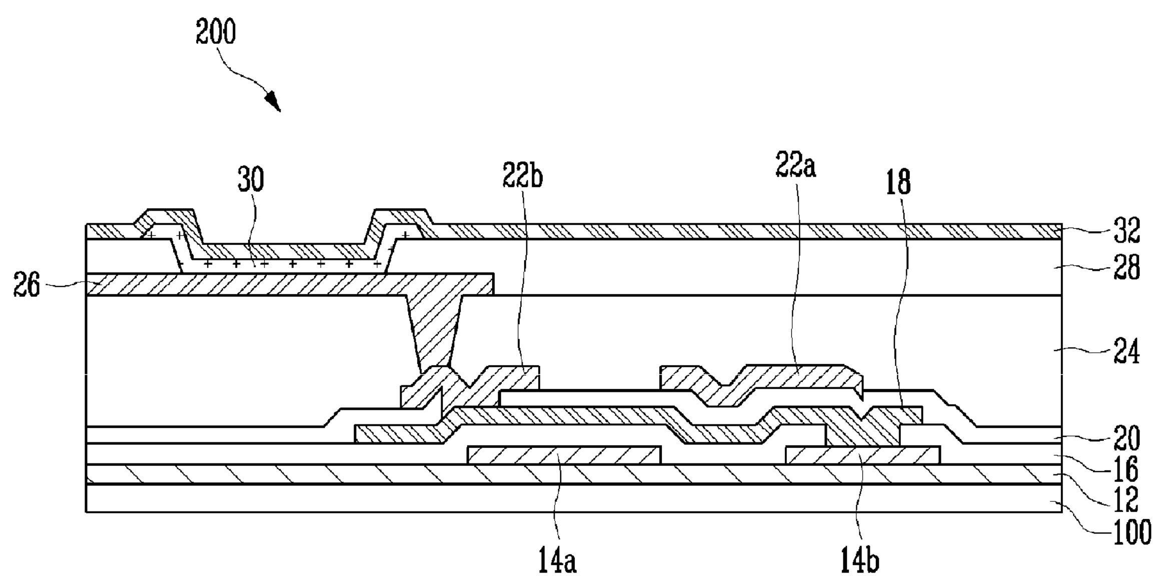
FIG. 5 is a sectional view illustrating an organic light emitting element of FIG. 4A.

FIG. 5 is a sectional view illustrating an organic light emitting element of FIG. 4A. Referring to FIG. 5, the organic light emitting element 200 includes an anode electrode 26, a cathode electrode 32, and an organic light emitting layer 30 formed between the anode and cathode electrodes 26 and 32. The organic light emitting layer 30 may further include a hole injection layer, a hole transport layer, an electron transport layer and an electron transport layer. The organic light emitting element 200 may further include a TFT for controlling the operation of the organic light emitting element 200 and a capacitor for maintaining signals.

The TFT has the structure illustrated in FIG. 1 or 2. The TFT may be manufactured using the method described with reference to FIGS. 3A to 3D.

The organic light emitting element 200 having a TFT configured as described above will be described in a more detailed manner with respect to FIGS. 4A and 5.

A buffer layer 12 is formed on the substrate 100, and a first gate electrode 14*a* and a source electrode 14*b* are formed on the buffer layer 12. A first insulating layer 16 is formed on the buffer layer 12 having the first gate electrode 14*a* and the source electrode 14*b*. An active layer 18 formed of an oxide semiconductor is formed on the first insulating layer 16 having the first gate electrode 14*a* and the source electrode 14*b*. One side portion of the active layer 18 is connected to the source electrode 14*b* through a contact hole formed in the first insulating layer 16.

A second insulating layer 20 is formed on the first insulating layer 16 having the active layer 18, and a second gate electrode 22*a* and a drain electrode 22*b* are formed on the second insulating layer 20. The second gate electrode 22*a* is formed in a non-symmetric structure so as not to overlap with the first gate electrode 14*a*, and the drain electrode 22*b* is connected to the other side portion of the active layer 18 through a contact hole formed in the second insulating layer 20.

A protection layer 24 for insulation and planarization is formed on the second insulating layer 20 having the second gate electrode 22*a* and the drain electrode 22*b*, and a via hole is formed in the protection layer 24 so that the drain electrode 22*b* is exposed. An anode electrode 26 connected to the drain electrode 22*b* through a via hole is formed on the protection layer 24. A pixel defining layer 28 is formed on the protection layer 24 having the anode electrode 26 so that a region (light emitting region) of the anode electrode 26 is exposed. An organic light emitting layer 30 is formed on the exposed anode electrode 26. A cathode electrode 32 is formed on the pixel defining layer 28 having the organic light emitting layer 30.

Referring to FIG. 4B, a sealing substrate 400 for sealing the pixel region 120 is disposed above the substrate 100 on which the organic light emitting element 100 is formed. The sealing substrate 400 is joined with the substrate 100 by a sealing member 410, thereby completing the display panel 300.

In an organic light emitting display device configured as described above, the light emitting characteristics of the organic light emitting element 200 can be improved by the TFT having improved current characteristics, thereby implementing high-luminance and high-quality images.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A thin film transistor (TFT) comprising:

a substrate;

a first gate electrode formed on the substrate;

a source electrode formed to be spaced apart from the gate electrode on the substrate;

a first insulating layer formed on the substrate having the first gate electrode and the source electrode;

an active layer formed of an oxide semiconductor on the first insulating layer having the first gate electrode and the source electrode, the active layer being connected to the source electrode;

a second insulating layer formed on the first insulating layer having the active layer;

a second gate electrode formed on the second insulating layer so as not to overlap with the first gate electrode; and a drain electrode formed to be spaced apart from the second gate electrode on the second insulating layer, the drain electrode being connected to the active layer.

2. The TFT according to claim 1, wherein the active layer is connected to the source electrode through a contact hole formed in the first insulating layer.

3. The TFT according to claim 1, wherein the oxide semiconductor includes zinc oxide (ZnO).

4. The TFT according to claim 3, wherein the oxide semiconductor is doped with at least one ion selected from the group consisting of gallium (Ga), indium (In), stannum (Sn), zirconium (Zr), halfnium (Hf), cadmium (Cd), magnesium (Mg) and vanadium (V).

5. The TFT according to claim 1, wherein the drain electrode is connected to the active layer through a contact hole formed in the second insulating layer.

6. The TFT according to claim 1, wherein one side portions of the first and second gate electrodes are spaced apart from each other by a predetermined gap.

7. The TFT according to claim 1, wherein the first gate electrode and the source electrode are formed of a same material.

8. The TFT according to claim 1, wherein the second gate electrode and the drain electrode are formed of a same material.

9. An organic light emitting display device comprising:

a first substrate having an organic light emitting element and a TFT formed thereon, the organic light emitting element having a first electrode, an organic light emitting layer and a second electrode, and the TFT controlling operations of the organic light emitting element; and a second substrate disposed opposite to the first substrate, wherein the TFT comprises:

a first gate electrode formed on the first substrate;

a source electrode formed to be spaced apart from the gate electrode on the first substrate;

a first insulating layer formed on the first substrate having the first gate electrode and the source electrode;

an active layer formed of an oxide semiconductor on the first insulating layer having the first gate electrode and the source electrode, the active layer being connected to the source electrode;

a second insulating layer formed on the first insulating layer having the active layer;

a second gate electrode formed on the second insulating layer so as not to overlap with the first gate electrode; and a drain electrode formed to be spaced apart from the second gate electrode on the second insulating layer, the drain electrode being connected to the active layer.

10. The organic light emitting display device according to claim 9, wherein the active layer is connected to the source electrode through a contact hole formed in the first insulating layer.

11. The organic light emitting display device according to claim 9, wherein the oxide semiconductor includes zinc oxide (ZnO).

12. The organic light emitting display device according to claim 11, wherein the oxide semiconductor is doped with at least one ion selected from the group consisting of gallium (Ga), indium (In), stannum (Sn), zirconium (Zr), halfnium (Hf), cadmium (Cd), magnesium (Mg) and vanadium (V).

13. The organic light emitting display device according to claim 9, wherein the drain electrode is connected to the active layer through a contact hole formed in the second insulating layer.

14. The organic light emitting display device according to claim 9, wherein one side portion of the second gate electrode is spaced apart from one side portion of the first gate electrode by a predetermined gap.

15. The organic light emitting display device according to claim 9, wherein the first gate electrode and the source electrode are formed of a same material.

16. The organic light emitting display device according to claim 9, wherein the second gate electrode and the drain electrode are formed of the same material.

* * * * *